Figure 2A:
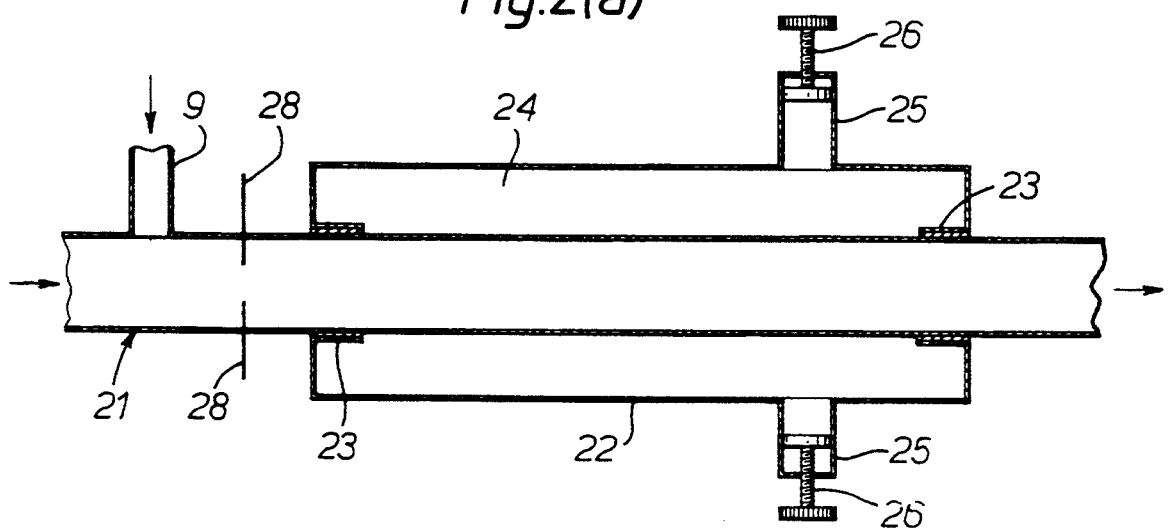

United States Patent [19]

Griffiths et al.

[11] Patent Number: 5,340,450
[45] Date of Patent: Aug. 23, 1994

[54] REMOVAL OF ORGANIC MATERIALS FROM A GAS

[75] Inventors: Christopher N. Griffiths, Abingdon; David Raybone, Stow on the Wold; Keith H. Bayliss, Bridgnorth, all of United Kingdom

[73] Assignee: United Kingdom Atomic Energy Authority, Harwell, United Kingdom

[21] Appl. No.: 977,045

[22] Filed: Nov. 16, 1992

[30] Foreign Application Priority Data

Dec. 10, 1991 [GB] United Kingdom ............ 9126179.2

[51] Int. Cl.$^5$ ............................................. B01D 53/00
[52] U.S. Cl. .............................. 204/157.3; 204/157.43; 204/157.47; 204/157.5; 204/158.21; 588/205; 588/227
[58] Field of Search .............................. 588/205, 227; 204/157.3, 157.43, 157.47, 157.5, 158.21; 422/186

[56] References Cited

U.S. PATENT DOCUMENTS

| | | | |
|---|---|---|---|
| 3,843,457 | 10/1974 | Grannen et al. | 201/2.5 |
| 4,076,606 | 2/1978 | Suzuki et al. | 204/157.1 R |
| 4,279,722 | 7/1981 | Kirkbride | 204/158.21 |
| 4,438,706 | 3/1984 | Boday et al. | 588/227 |
| 4,825,651 | 5/1989 | Puschner et al. | 60/275 |
| 5,164,054 | 11/1992 | Cha et al. | 204/157.47 |

FOREIGN PATENT DOCUMENTS 1104777 of 1989 Japan.
9103281 3/1991 PCT Int'l Appl.

OTHER PUBLICATIONS

CA 112(12):109148m (attached to Up. Kokai see Foreign Patent Documents).

Primary Examiner—John Niebling
Assistant Examiner—C. Delacroix-Muirheid
Attorney, Agent, or Firm—William R. Hinds

[57] ABSTRACT

A method of and apparatus for removing organic material from a gas. The method comprises the operation of subjecting the gas to pulses of circularly polarised microwave radiation and the apparatus comprises a reaction chamber through which the gas can be passed, means for generating circularly polarised microwave radiation and means for applying the circularly polarised microwave radiation to the gas in the reaction chamber.

9 Claims, 2 Drawing Sheets

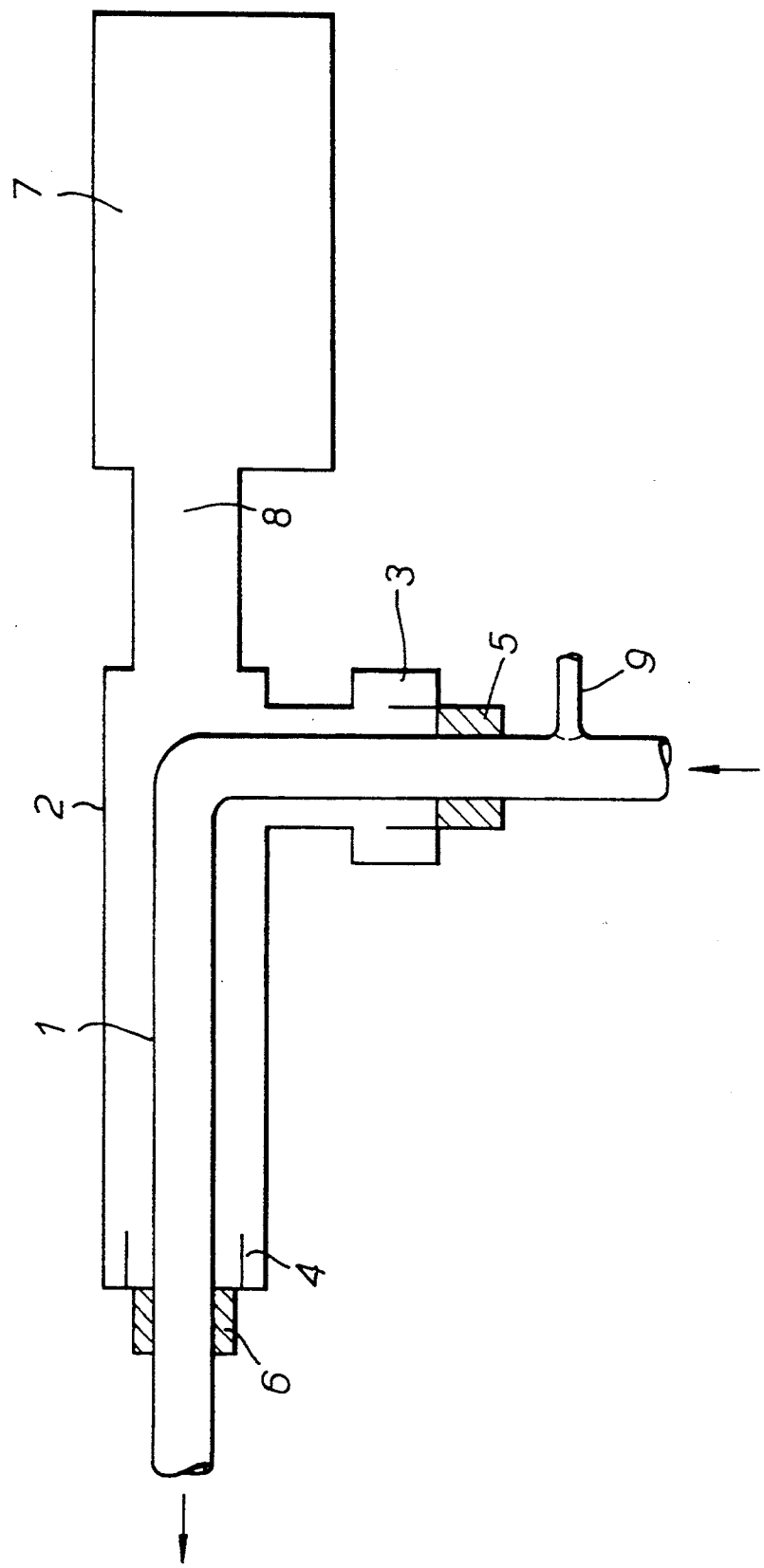

REMOVAL OF ORGANIC MATERIALS FROM A GAS

The present invention relates to the removal of organic materials from a gas and more particularly to the removal of volatile organic pollutants from solvent/air mixtures and waste gas streams from hydrocarbon combustion and incineration processes.

Several techniques already are known for the control or abatement of volatile organic compounds in gaseous effluents. These techniques can be divided into two groups, those based on chemical processes and those based on electrical methods. In the former group there are included adsorption with steam or air stripping, condensation, incineration and biological degradation. In the latter group there are included a number of plasma based processes. These fall into four distinct categories:
 a) electron beam processes,
 b) atmospheric pressure corona discharge systems,
 c) reduced pressure non-thermal glow discharge processes, and
 d) atmospheric pressure thermal plasma torch processes.

(In practice these processes are essentially a particular method of incineration).

However, none of the methods used hitherto has been entirely satisfactory. In particular, the known plasma based processes have a limited range of applicability because of factors such as the power consumption required, operating lifetimes of electrode structures, radiation shielding requirements or the need to transport electron beams over appreciable distances. Those plasma based techniques which require reduced pressure operating conditions have the further problem of compatibility with ambient, or higher, pressure process gas streams.

In general, abatement techniques will vary depending on the type, concentration and environment of the volatile organic compounds. Although the present invention is of general applicability, it is particularly useful for the removal of volatile organic compounds from mixtures where their concentration is low such as a final clean-up stage after the treatment of a process gas stream by other, less efficient processes.

According to the present invention in one aspect there is provided a method of removing gaseous organic materials from a gas, comprising the operation of subjecting a gas from which gaseous organic materials are to be removed to pulses of circularly polarised microwave radiation.

There may be included the operation of adding an activator gas to the gas either before or immediately after it has been subjected to the action of the microwave radiation.

According to the present invention in a more particular aspect, there is provided a method of treating a process gas to remove a volatile organic contaminant therefrom, including providing a supply of process gas containing a volatile organic contaminant which is to be removed, passing the process gas through a reactor chamber, and establishing within the reactor chamber a pulsed, circularly polarized microwave electric field of a magnitude such as to excite the process gas to a plasma state thereby to decompose the organic contaminant of the process stream.

Also according to the invention there is provided an apparatus for the removal of gaseous organic materials from a gas, comprising means for generating pulses of circularly polarised microwave energy, a reaction chamber into which a gas from which gaseous organic materials are to be removed can be admitted, and means for applying the microwave energy to the gas within the reaction chamber.

The apparatus may include means for ionizing the gas before it is subjected to the microwave radiation.

There may be included also means for adding an activator gas to the gas either before or immediately after it has been subjected to the microwave radiation.

Suitable activator gases are water vapour, helium or oxygen or mixtures thereof.

The reaction chamber may comprise a region of ducting made of quartz or a ceramic material and the means for applying the microwave radiation to the reaction chamber may comprise a microwave resonant cavity surrounding the reaction chamber.

Figure 2B:
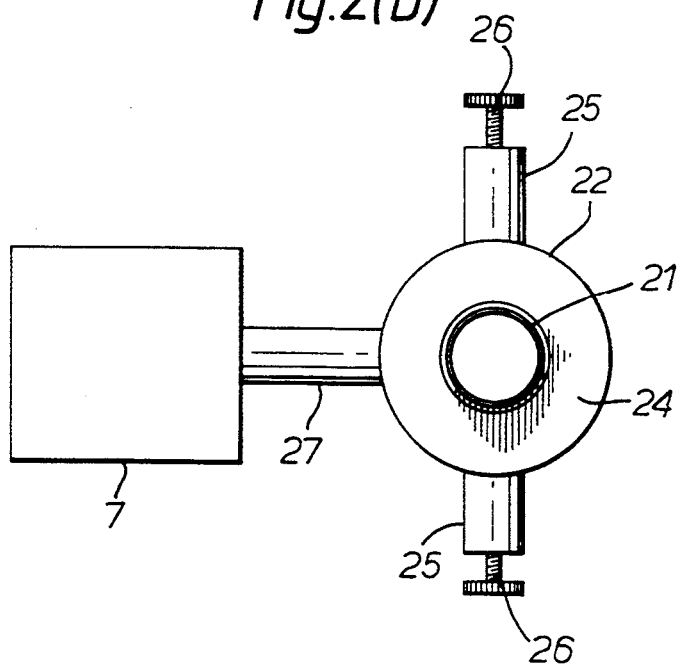

The invention will now be described, by way of example with reference to the accompanying drawings in which FIG. 1 is a diagrammatic representation of an apparatus for carrying out the process of the invention and FIG. 2 is a diagrammatic representation in longitudinal and transverse section of a second apparatus for carrying out the invention.

Referring to FIG. 1 of the drawings, an apparatus for removing gaseous organic materials from a gas stream comprises, a reaction chamber 1 in the form of a tube made of silica or other suitable ceramic such as alumina through which a gas from which organic materials are to be removed can be passed. Surrounding the reaction chamber 1 is microwave resonant cavity comprising of a section of wave guide 2 of L-shaped configuration an upstream end of which is closed by a reflecting choke and mode suppressor 3 and a downstream end of which is closed by a reflecting choke 4. The reflecting choke and mode suppressor 3 and choke 4 have associated with them microwave absorbers 5 and 6, respectively. Pulses of microwave power are applied to the waveguide 2, and hence the reaction chamber 1, from a microwave source 7 via a circular polariser 8, thus enabling a plasma to be generated in the reaction chamber 1. An inlet port 9 enables an activator gas to be added from a source, not shown, to the gas.

Referring to FIG. 2 of the drawings, those components which are similar to those of the embodiment of FIG. 1, bear similar reference numerals. The L-shaped reactor chamber 1 and resonant cavity 2 are replaced by a straight silica reaction chamber 21 which is surrounded by a metal cylinder 22 which has re-entrant ends 23. The cylinder 22 forms a microwave resonant cavity 24. The re-entrant ends 23 prevent the leakage of microwave radiation from the cavity 24 in an axial direction. Two opposed stubs 25 are fitted with adjustable blanking ends 26, which enable the cavity 24 to be tuned to a resonant condition. A microwave injection stub and circular polariser 27 also is attached to the cavity 24, although other forms of microwave coupling device can be used if desired. Two electrodes 28 positioned upstream of the reaction chamber 21 enable a process gas to be pre-ionised if desired.

Usually a microwave induced plasma has a tendency to break down into striations which tend to follow the electric vector of the electric field which is the source of the plasma. The electric vector of a circularly polarised electric field rotates continuously and hence such breakdown is prevented. Also the use of short ($\sim <\mu s$) pulses inhibits glow-to-arc transitions and so promotes a uniform glow discharge.

In one process according to the invention, air saturated with propan-2-ol at 20° C. was passed through the apparatus of FIG. 1 at a rate of 1 liter/min. The mixture was subjected to pulses of microwave energy having an average power of 800 watts, a peak power of 1 Mw, a pulse width of 1 $\mu$sec and a pulse repetition frequency of 600 Hz.

The propan-2-ol was converted to carbon, which was deposited on the wall of the tube downstream of the reaction chamber 1, carbon dioxide and water vapour.

We claim:

1. A method of treating a process gas to remove a volatile organic contaminant therefrom, including providing a supply of process gas containing a volatile organic contaminant which is to be removed, passing the process gas through a reactor chamber, and establishing within the reactor chamber a pulsed, circularly polarized microwave electric field of a magnitude such as to excite the process gas to a plasma state thereby to decompose the organic contaminant of the process stream.

2. A method according to claim 1 including adding to the process gas an activator gas adapted to facilitate the decomposition of the organic material.

3. A method according to claim 2 wherein the activator gas is water vapor, helium, oxygen or mixtures thereof.

4. A method according to claim 1 wherein the duration of the pulses of microwave energy is less than a microsecond.

5. A method according to claim 1 wherein the mean power of the pulses of microwave energy is of the order of a kilowatt and the peak power is of the order of a megawatt.

6. A method according to claim 1 including the operation of ionizing the process gas in addition to subjecting it to the pulses of microwave radiation.

7. A method as claimed in claim 1 wherein the process gas is from the group consisting of solvent/air mixtures and waste gas streams from hydrocarbon combustion and incineration processes.

8. A method as claimed in claim 1 wherein the circularly polarized microwave electric field is such as to prevent a tendency of microwave induced plasma to otherwise break down into striations which tend to follow the electric vector of an electric field which is the source of a plasma.

9. A method as claimed in claim 1 wherein the pulses of the pulsed field are sufficiently short to inhibit glow-to-arc transitions and so promote a uniform glow discharge.

* * * * *